(12) United States Patent
Lee et al.

(10) Patent No.: US 11,431,165 B2
(45) Date of Patent: Aug. 30, 2022

(54) ESD PROTECTION CIRCUIT FOR I/O BUFFER

(71) Applicant: DB HiTek, Co., Ltd., Seoul (KR)

(72) Inventors: Sang-Mok Lee, Incheon (KR); Joon-Tae Jang, Seoul (KR); Seung-Hoo Kim, Seoul (KR); Jae-Ah Cha, Gimpo-si (KR)

(73) Assignee: DB HiTek, Co., Ltd., Seoul (KR)

( * ) Notice: Subject to any disclaimer, the term of this patent is extended or adjusted under 35 U.S.C. 154(b) by 0 days.

(21) Appl. No.: 16/999,958

(22) Filed: Aug. 21, 2020

(65) Prior Publication Data

US 2021/0281066 A1    Sep. 9, 2021

(51) Int. Cl.
*H02H 9/04* (2006.01)

(52) U.S. Cl.
CPC .................................. *H02H 9/045* (2013.01)

(58) Field of Classification Search
CPC ...................................................... H02H 9/045
USPC .......................................................... 361/56
See application file for complete search history.

(56) References Cited

U.S. PATENT DOCUMENTS

| 5,864,243 | A  | * | 1/1999  | Chen ................ | H03K 19/00315 |
|           |    |   |         |                     | 326/58 |
| 6,927,602 | B2 | * | 8/2005  | Ker .................. | H03K 17/08142 |
|           |    |   |         |                     | 326/58 |
| 7,706,115 | B2 | * | 4/2010  | Hsiung ............ | H03K 19/00315 |
|           |    |   |         |                     | 361/91.1 |
| 2004/0218322 | A1 | * | 11/2004 | Chen .................... | H01L 27/0285 |
|           |    |   |         |                     | 361/56 |
| 2010/0097117 | A1 | * | 4/2010  | Wang ................. | H03K 19/0013 |
|           |    |   |         |                     | 327/333 |

* cited by examiner

*Primary Examiner* — Thienvu V Tran
*Assistant Examiner* — Sreeya Sreevatsa
(74) *Attorney, Agent, or Firm* — Andrew D. Fortney; Central California IP Group, P.C.

(57) ABSTRACT

An ESD protection circuit for an input/output buffer in which when an ESD pulse or event occurs, an ESD surge on a pad is discharged to a diode and a transistor channel, thereby enhancing the efficiency of the ESD protection circuit. The ESD protection circuit includes a floating N-well bias circuit connected to a pad at an output of driver circuit and outputting a bias voltage based on or in response to a supply voltage; a switch circuit connected to a logic circuit and the driver circuit, and configured to connect and disconnect the logic circuit and the driver circuit based on or in response to the supply voltage; and a pull-down circuit connected to the driver circuit, configured to output a voltage to the driver circuit based on or in response to the supply voltage.

7 Claims, 5 Drawing Sheets

ESD PROTECTION CIRCUIT FOR I/O BUFFER

CROSS REFERENCE TO RELATED APPLICATION

The present application claims priority to Korean Patent Application No. 10-2020-0026949, filed Mar. 4, 2020, the entire contents of which are incorporated herein for all purposes by this reference.

BACKGROUND OF THE INVENTION

Field of the Invention

The present invention relates to an ESD protection circuit for an input/output buffer. More particularly, the present invention relates to an ESD protection circuit that, when an ESD pulse or event occurs, discharges an ESD surge and/or current on a pad to a diode and/or through a channel of a driver transistor, thereby enhancing the efficiency of an ESD protection device in the ESD protection circuit. The ESD protection circuit includes a floating N-well bias circuit connected to a pad at an output of an I/O driver (e.g., a driver circuit), the floating N-well bias circuit having an output voltage based on or in response to a supply voltage; a switch circuit connected to an I/O logic (e.g., a logic circuit) and the I/O driver, the switch circuit being configured to switch a connection between (e.g., reversibly connect and disconnect) the I/O logic and the I/O driver based on or in response to the supply voltage; and a pull-down circuit connected to the I/O driver, the pull-down circuit outputting a voltage to the I/O driver based on or in response to the supply voltage.

Description of the Related Art

An input/output buffer is a circuit for transmitting and receiving signals between chips. The input/output buffer is provided in various forms depending on the system. The input/output buffer includes an input/output pad (I/O Pad) that receives inputs to and provides outputs from a chip.

In general, a CMOS chip is vulnerable to electrostatic discharge (hereinafter, referred to as "ESD"). When ESD is received at an input/output pad, the performance may rapidly decrease, or a malfunction may occur.

When an extremely large voltage is applied to a semiconductor device due to ESD, fatal destruction, such as a junction breakdown, a dielectric breakdown, metal melting, or the like may occur in the device. This causes reduction in the operating life and deterioration in performance of the device, even when a relatively small voltage is applied. As the dimensions of semiconductor devices become smaller, the devices are more susceptible to damage caused by electrostatic discharge. Therefore, from the manufacture of the devices to the use thereof, extensive and diversified research has been conducted to protect semiconductor devices from transient voltages such as electrostatic discharge and the like.

The degree of failure in any device caused by electrostatic discharge depends on characteristics and functions of the device, its manufacturing process, the design rules, the package type, and the like. For example, in a CMOS device, an N-conducting channel type MOSFET (hereinafter, referred to as an "NMOS transistor") is more easily damaged by electrostatic discharge, compared to a P-conducting channel type MOSFET (hereinafter, referred to as a "PMOS transistor"). This is because the trigger voltage and the holding voltage of the NMOS transistor are lower than the breakdown voltages of the diode, the PMOS transistor, and the NPN and PNP parasitic bipolar junction transistors formed in typical CMOS manufacturing processes.

Accordingly, in the related art, semiconductor chips often include an input/output buffer with an output driver that discharges ESD through a CMOS junction diode to protect the chip. Particularly, the diode has been effectively used to protect the gate oxides of the device by clamping a transient ESD voltage at an input terminal of the CMOS device.

However, the diode has a large reverse-biased dynamic resistance, and thus the diode does not always shunt a large current caused by electrostatic discharge sufficiently rapidly at the output terminal of the CMOS device.

In addition, conventionally, when the CMOS chip is on during an ESD event, the amount of discharge current increases, even though the driver size does not.

However, in the related art, the circuit structure limits ESD control to only the NMOS transistor in the driver, the area of the ESD control circuit is increased by adding two PMOS transistor drivers in series, or the ESD control is possible only through a power clamp including an ESD trigger circuit.

The foregoing is intended merely to aid in the understanding of the background of the present invention, and is not intended to mean that the present invention falls within the purview of the related art that is already known to those skilled in the art.

SUMMARY OF THE INVENTION

The present invention is to solve the problems in the related art described above.

In general, the function of an ESD protection device is only to discharge an ESD surge current using a junction diode (e.g., an appropriately-configured MOS transistor). However, an ESD protection circuit for an input/output buffer according to the present invention increases the amount of current to be discharged by detecting an ESD pulse or event and shunting the ESD current through a channel of an ESD device using a control circuit.

In addition, an ESD protection circuit for an input/output buffer according to various embodiments of the present invention controls, protects and/or uses both an NMOS transistor and a PMOS transistor (e.g., of the driver circuit in the input/output buffer), thereby enabling discharge in two directions (e.g., towards a supply voltage DVDD and a ground potential or ground plane DVSS).

In addition, a switch circuit in an ESD protection circuit for an input/output buffer according to one or more embodiments of the present invention solves a problem that occurs when only an NMOS transistor (e.g., in the driver circuit of the input/output buffer) is used (e.g., to shunt ESD current and/or voltage), and the voltage on a node (e.g., an output driver pulldown node) in the input/output buffer does not increase to an supply voltage DVDD during normal operation, and thus, the NMOS transistor in the driver circuit is weakened.

In addition, a pull-down circuit in the ESD protection circuit for an input/output buffer according to one or more embodiments of the present invention may operate only when an ESD pulse or event occurs, to minimize the influence (e.g., of the present ESD protection circuit) on the normal operation (e.g., of the input/output buffer).

In addition, a floating N-well bias circuit in the ESD protection circuit for an input/output buffer according to one or more embodiments of the present invention may have a relatively small or minimum size, but does not provide a leakage path during either normal operation or an ESD shunting operation.

The present invention may be implemented by various embodiments having the following configurations to achieve the above-described objectives.

According to various embodiments of the present invention, there is provided an ESD protection circuit for an input/output buffer, the ESD protection circuit including a floating N-well bias circuit connected to a pad at an output of a driver circuit, the floating N-well bias circuit having an output voltage based on or in response to an supply voltage; a switch circuit connected to a logic circuit and the driver circuit, the switch circuit being configured to switch a connection between (e.g., connect and disconnect) the logic circuit and the driver circuit based on or in response to the supply voltage; and a pull-down circuit connected to the driver circuit, the pull-down circuit outputting seta voltage to the driver circuit based on or in response to the supply voltage.

According to other embodiments of the present invention, in the ESD protection circuit for the input/output buffer, an output voltage from the floating N-well bias circuit may be a floating N-well bias voltage, and the floating N-well bias circuit may output the supply voltage (DVDD) as the floating N-well bias voltage during normal operation.

According to still other embodiments of the present invention, in the ESD protection circuit for the input/output buffer, the output voltage of the floating N-well bias circuit may be the floating N-well bias voltage, and the floating N-well bias circuit may output a voltage on the pad as the floating N-well bias voltage when the supply voltage is at or near a ground potential.

According to still other embodiments of the present invention, in the ESD protection circuit for the input/output buffer, the switch circuit may connect the logic circuit and a pull-down node to the driver circuit when the supply voltage is in a normal range.

According to still further embodiments of the present invention, in the ESD protection circuit for the input/output buffer, the switch circuit may disconnect the logic circuit and the pull-down node when an ESD pulse or event occurs.

According to still another embodiment of the present invention, in the ESD protection circuit for the input/output buffer, the pull-down circuit may operate in a sleep mode when the supply voltage is in a normal range.

According to yet still another embodiment of the present invention, in the ESD protection circuit for the input/output buffer, the pull-down circuit may output a ground potential or a voltage of 0 V to a pullup node of the driver circuit when an ESD pulse or event occurs.

According to one or more embodiments of the present invention, there is provided a floating N-well bias circuit connected to a driver circuit, the floating N-well bias circuit including a first PMOS transistor (PM2) having a gate receiving a supply voltage and a source of connected to a pad at an output of the driver circuit; a second PMOS transistor (PM3) having a gate connected to a drain of the first PMOS transistor, a source receiving the supply voltage, and a drain connected to an output of the floating N-well bias circuit; a third PMOS transistor (PM4) having a gate receiving the supply voltage, a source connected to the pad, and a drain is connected to the floating N-well node; and a first NMOS transistor (NM2) having (i) a gate receiving the supply voltage and (ii) a source connected to the drain of the first PMOS transistor and the gate of the second PMOS transistor.

According to one or more other embodiments of the present invention, in the floating N-well bias circuit, when the supply voltage is in a normal range, the first NMOS transistor may output a ground potential or a voltage of 0 V to the gate of the second PMOS transistor, and the second PMOS transistor may output the supply voltage as the output of the floating N-well bias circuit.

According to still further embodiments of the present invention, in the floating N-well bias circuit, when the supply voltage is at or near a ground potential, the first PMOS transistor may output a voltage on the pad to the gate of the second PMOS transistor.

According to yet still further embodiments of the present invention, in the floating N-well bias circuit, the third PMOS transistor may output the voltage on the pad when the supply voltage is at or near the ground potential.

According to an embodiment of the present invention, there is provided a switch circuit configured to connect and disconnect a logic circuit and a driver circuit (e.g., in an I/O buffer), the switch circuit including a first PMOS transistor (PM1) having a gate connected to a pad at an output of the driver circuit, a source connected to the logic circuit, and a drain connected to a gate of a first NMOS transistor (NM0) in the driver circuit; and a second NMOS transistor (NM1) having a gate receiving a supply voltage, a source connected to the logic circuit, and a drain connected to the driver circuit.

According to one or more other embodiments of the present invention, in the switch circuit, when the supply voltage is in a normal range, the second NMOS transistor may forma path between a pull-down node to the driver circuit and the logic circuit, and the second NMOS transistor may pass an output of the logic circuit (e.g., that may be either 0 V or the supply voltage) to the pull-down node.

According to yet other embodiments of the present invention, in the switch circuit, when the supply voltage is at or near a ground potential, the second NMOS transistor and the PMOS transistor may be off and when an ESD pulse or event occurs at the pad, an overlap capacitance between the pulldown node and the pad may block or disconnect a current at or on the pulldown node from the logic circuit.

According to one or more embodiments of the present invention, there is provided a pull-down circuit including a first NMOS transistor (NM3) having a source connected to a pullup node to a driver circuit of an input/output buffer; a second NMOS transistor (NM6) having a gate receiving a supply voltage and a source connected to a gate of the first NMOS transistor; a first PMOS transistor (PM5) having a source and a drain connected to a pad at an output of the driver circuit; and a second PMOS transistor (PM6) having a gate receiving the supply voltage, a source connected to a gate of the first PMOS transistor, and a drain connected to the source of the second NMOS transistor and to the gate of the first NMOS transistor.

According to other embodiments of the present invention, in the pull-down circuit, when the supply voltage is in a normal range, the second NMOS transistor may output a voltage of 0 V to the gate of the first NMOS transistor , and the first NMOS transistor may block or disconnect the pullup node from a ground potential.

According to still other embodiments of the present invention, the pull-down circuit may further include a resistor connected to the gate of the first PMOS transistor, wherein the first PMOS transistor and the resistor may increase power to the source of the second PMOS transistor, when an ESD pulse or event occurs.

According to still further embodiments of the present invention, in the pull-down circuit, when the supply voltage is at or near a ground potential, the second PMOS transistor may apply a voltage on the pad to the first NMOS transistor. The first NMOS transistor may turn on when an ESD event occurs at the pad.

According to still further embodiment of the present invention, in the pull-down circuit, the first NMOS transistor may output a ground potential or a voltage of 0 V to the pullup node when an ESD event occurs at the pad, and the pullup node is connected to a gate of a third PMOS transistor (PM0) in the driver circuit.

According to yet still another embodiment of the present invention, in the pull-down circuit, the first NMOS transistor may transfer a current on or at the pad during an ESD event to a source of the supply voltage.

According to the above configurations, the present invention has the following effects.

In general, the function of an ESD protection device is to discharge an ESD surge (e.g., an ESD voltage or current) using a MOS transistor configured or functioning as a junction diode. However, the present ESD protection circuit increases the amount of current to be discharged by detecting an ESD pulse or event, and shunting at least part of the ESD current through the channel of an ESD device using a control circuit.

In addition, the ESD protection circuit for the input/output buffer according to embodiments of the present invention controls both the NMOS transistor and the PMOS transistor (e.g., of the driver circuit), thereby enabling discharge of ESD current and/or voltage in two directions (i.e., towards the supply voltage DVDD and the ground potential DVSS).

In addition, the switch circuit of the ESD protection circuit for the input/output buffer according to embodiments of the present invention solves a problem that occurs when only the NMOS transistor (e.g., in the driver circuit of the input/output buffer) is used (e.g., to shunt ESD current and/or voltage), and the voltage on the pulldown node (e.g., to the driver circuit in the input/output buffer) cannot increase to the supply voltage DVDD during normal operation, and thus, the NMOS transistor in the driver circuit is weakened.

In addition, the pull-down circuit in the ESD protection circuit for the input/output buffer according to embodiments of the present invention operates only when an ESD pulse or event occurs, to minimize the influence (e.g., of the present ESD protection circuit) on normal operations (e.g., of the input/output buffer).

In addition, the floating N-well bias circuit of the ESD protection circuit for the input/output buffer according to embodiments of the present invention may have a relatively small or minimum size, without providing a leakage path during either normal operation or an ESD event (e.g., an ESD current or voltage shunting operation).

Effects indirectly or inherently described in the following specification that may be expected by or from the technical features of the present invention are considered as effects described in the present specification, even though these effects may not be clearly mentioned herein.

BRIEF DESCRIPTION OF THE DRAWINGS

The above and other objectives, features, and other advantages of the present invention will be more clearly understood from the following detailed description when taken in conjunction with the accompanying drawings, in which.

DETAILED DESCRIPTION OF THE INVENTION

It is noted that embodiments of the present invention may be changed to a variety of embodiments. The scope of the present invention should not be interpreted as being limited to the embodiments described hereinbelow, but should be interpreted on the basis of the descriptions in the appended claims. In addition, embodiments of the present invention are provided for reference in order to fully describe the invention to those skilled in the art.

Figure 1:
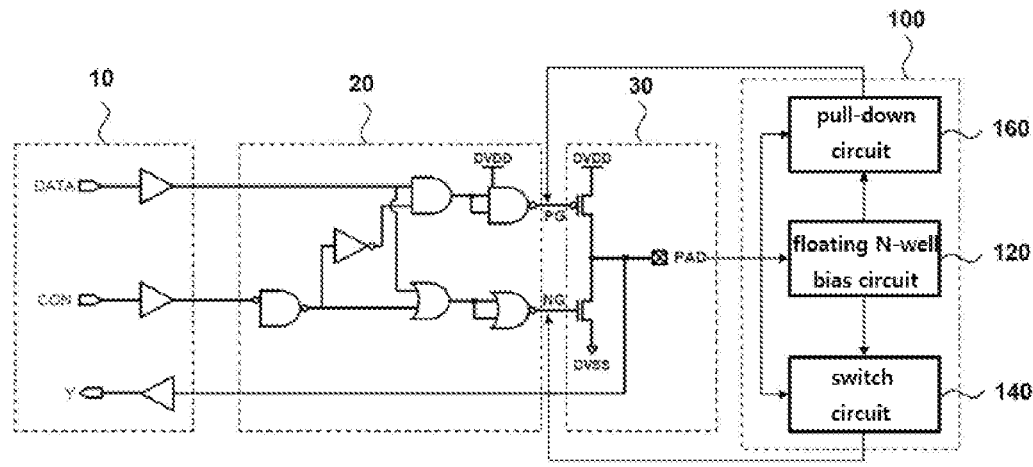
FIG. 1 is a diagram illustrating an exemplary ESD protection circuit for an input/output buffer according to various embodiments of the present invention.

Referring to FIG. 1, an ESD protection circuit 100 for an input/output buffer is a circuit that performs an ESD protection function for the input/output buffer, which comprises a bi-directional input/output circuit. Herein, the input/output buffer includes a level shifter 10, I/O logic (e.g., a logic circuit) 20, and an I/O driver (e.g., a driver circuit) 30. The ESD protection circuit 100 serves as a control block for the input/output buffer.

The level shifter 10 provides data DATA and a first control signal CON to the logic circuit 20. The level shifter 10 may receive an incoming signal Y from the driver circuit 30, which receives the incoming signal from an external circuit or chip.

The ESD protection circuit 100 includes a floating N-well bias circuit 120 connected to a pad (e.g., PAD) receiving an output from the driver circuit 30; a switch circuit 140 connected to a pulldown node (e.g., NG) that connects the logic circuit 20 and the driver circuit 30; and a pull-down circuit 160 connected to a pullup node PG that connects the logic circuit 20 and the driver circuit 30. Herein, the switch circuit 140 may be connected to the pulldown node in series, and the pull-down circuit may be connected to the pullup node PG in parallel.

The floating N-well bias circuit 120 sets the voltage on an output node FNW (see FIG. 2) according to an operation state (e.g., of the input/output buffer). That is, the floating N-well bias circuit 120 sets the floating N-well voltage to a supply voltage (e.g., a positive supply voltage, such as DVDD) in the case of normal operation. The floating N-well bias circuit 120 sets the floating N-well voltage to a pad voltage (e.g., a voltage on the pad) in the case of a ground potential.

Figure 2:
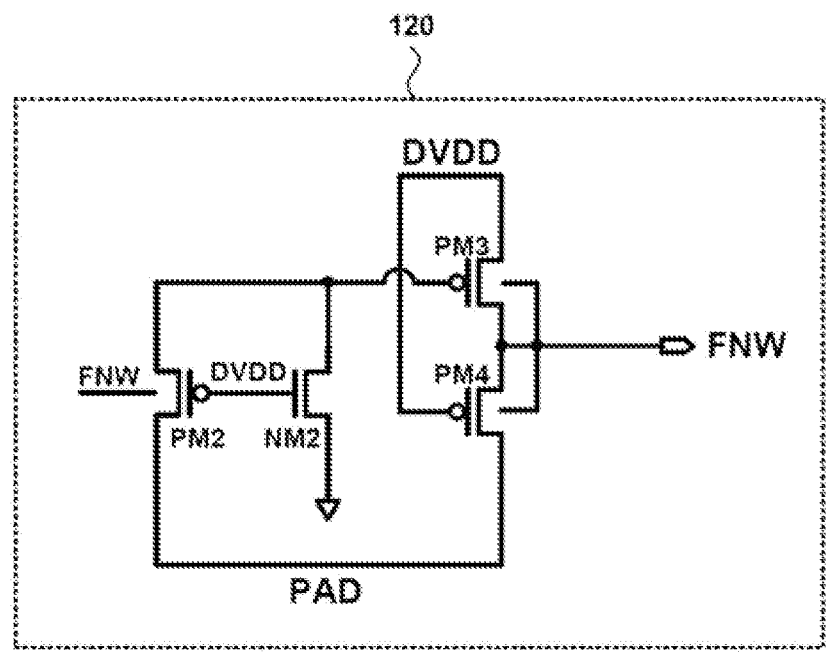
FIG. 2 is a diagram illustrating an exemplary floating N-well bias circuit suitable for the input/output buffer of FIG. 1.

To this end, the floating N-well bias circuit 120 (e.g., as shown in FIG. 2) may include one or more PMOS transistors, an NMOS transistor, and an output node (e.g., FNW). That is, referring to FIG. 2, the floating N-well bias circuit 120 may include an NMOS transistor NM2, a first PMOS transistor PM2, a second PMOS transistor PM3, and a third PMOS transistor PM4. The floating N-well bias circuit 120 operates in a normal mode when a positive output supply voltage (e.g., DVDD) is supplied (e.g., to the input/output buffer). When operating in the normal mode, the floating N-well bias circuit 120 may output an internal signal (e.g., FNW) to the pad or to a circuit that provides an output signal to the pad.

Referring to FIG. 2, the floating N-well bias circuit 120 includes PMOS transistors PM2, PM3, and PM4, and an NMOS transistor NM2.

The gate of the PMOS transistor PM2 receives the supply voltage DVDD. The source of the PMOS transistor PM2 is connected to the pad at an output of the driver circuit 30. The drain of the PMOS transistor PM2 is connected to the gate of the PMOS transistor PM3.

The gate of the PMOS transistor PM3 is connected to the drain of the PMOS transistor PM2. The source of the PMOS transistor PM3 receives the supply voltage DVDD. The drain of the PMOS transistor PM3 is connected to the floating N-well (output) node FNW.

The gate of the PMOS transistor PM4 receives the supply voltage DVDD. The source of the PMOS transistor PM4 is connected to the pad at the output of the driver circuit 30. The drain of the PMOS transistor PM4 is connected to the floating N-well (output) node FNW.

The gate of the NMOS transistor NM2 receives the supply voltage DVDD. The source of the NMOS transistor NM2 is connected to the drain of the PMOS transistor PM2 and the gate of the PMOS transistor PM3.

The NMOS transistor NM2 provides a voltage of 0 V to the gate of the PMOS transistor PM3 when the supply voltage DVDD is supplied to the floating N-well bias circuit 120. The gate voltage of 0 V turns on the PMOS transistor PM3, and the supply voltage DVDD is output to the floating N-well node FNW through the PMOS transistor PM3. Accordingly, the floating N-well voltage reaches (or is) the supply voltage DVDD.

Along with this, the gate of the PMOS transistor PM2 and the gate of the PMOS transistor PM4 receive the supply voltage DVDD, which turns off the PMOS transistor PM2 and the PMOS transistor PM4. As the PMOS transistor PM2 and the PMOS transistor PM4 are off, the gate voltage of 0 V is applied to the gate of the PMOS transistor PM3.

When the PMOS transistor PM4 is off, it disconnects or blocks a path between the pad and the floating N-well node FNW, so that during normal operation, the body (or bulk) of the PMOS transistor (e.g., PM2) is biased at the supply voltage DVDD.

In the meantime, when the supply voltage DVDD reaches a ground potential (e.g., as a result of being powered down or electrically disconnected from the power supply), the pad voltage (which may be subject to a positive ESD pulse or event) and the floating N-well bias circuit 120 output node have the same voltage, due to the PMOS transistor PM4 being conductive.

Herein, when the supply voltage is at a ground potential, the PMOS transistor PM2 is on. When the PMOS transistor PM2 is on, the gate of the PMOS transistor PM3 receives the voltage on the pad PAD. Accordingly, the PMOS transistor PM3 blocks the path between the floating N-well node and the supply voltage DVDD.

However, when the supply voltage DVDD is supplied to the input/output buffer, the floating N-well bias circuit 120 operates in the normal mode. When operating in the normal mode, the floating N-well bias circuit 120 outputs an internal signal or the supply voltage (e.g., DVDD) as a bias voltage to the bodies of various PMOS transistors in the input/output buffer and/or ESD protection circuit 100.

Figure 4:
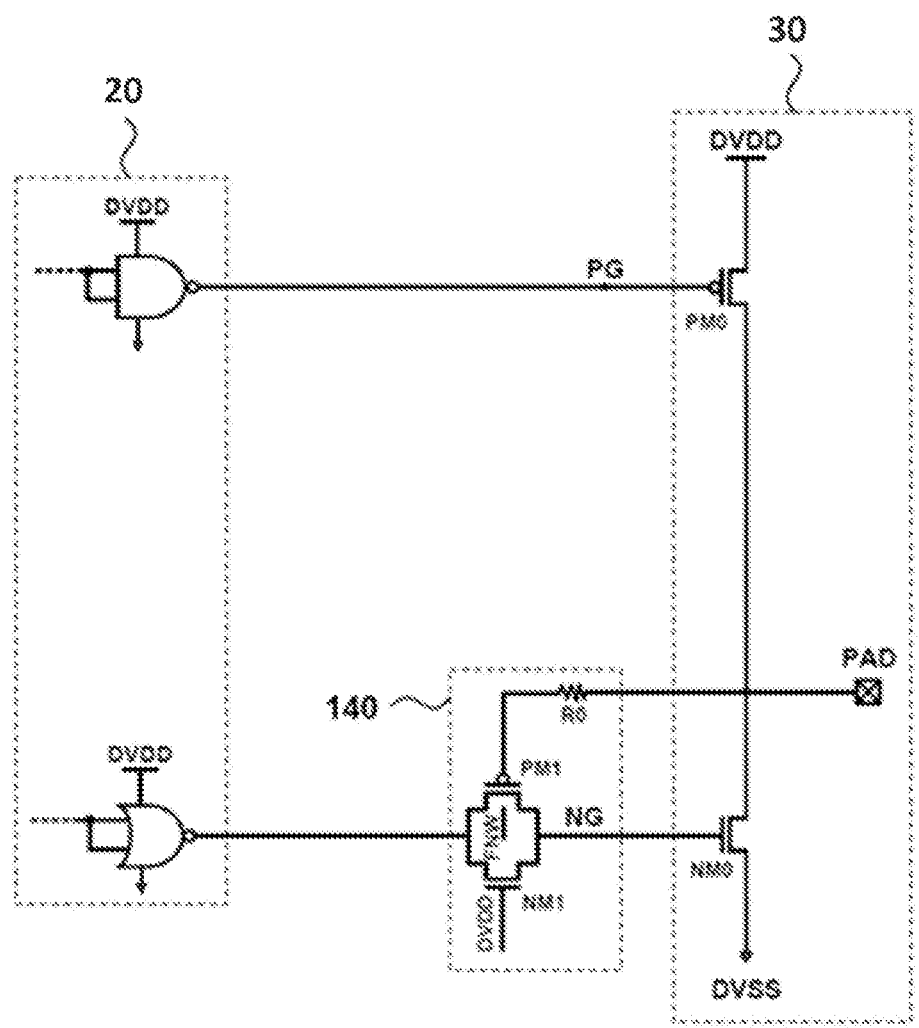

The switch circuit 140 switches the connection between (e.g., connects and disconnects) the logic circuit 20 and the N-channel MOSFET in the driver circuit 30 (e.g., at the pulldown node NG). That is, when the supply voltage DVDD is supplied (e.g., to the I/O buffer), the switch circuit 140 connects the logic circuit 20 and the pulldown node and/or the NMOS transistor NM0 (FIG. 4). When a positive ESD pulse or event having a relatively fast rising time occurs, the switch circuit 140 disconnects the logic circuit 20 and the pulldown node and/or the NMOS transistor NM0.

Figure 3:
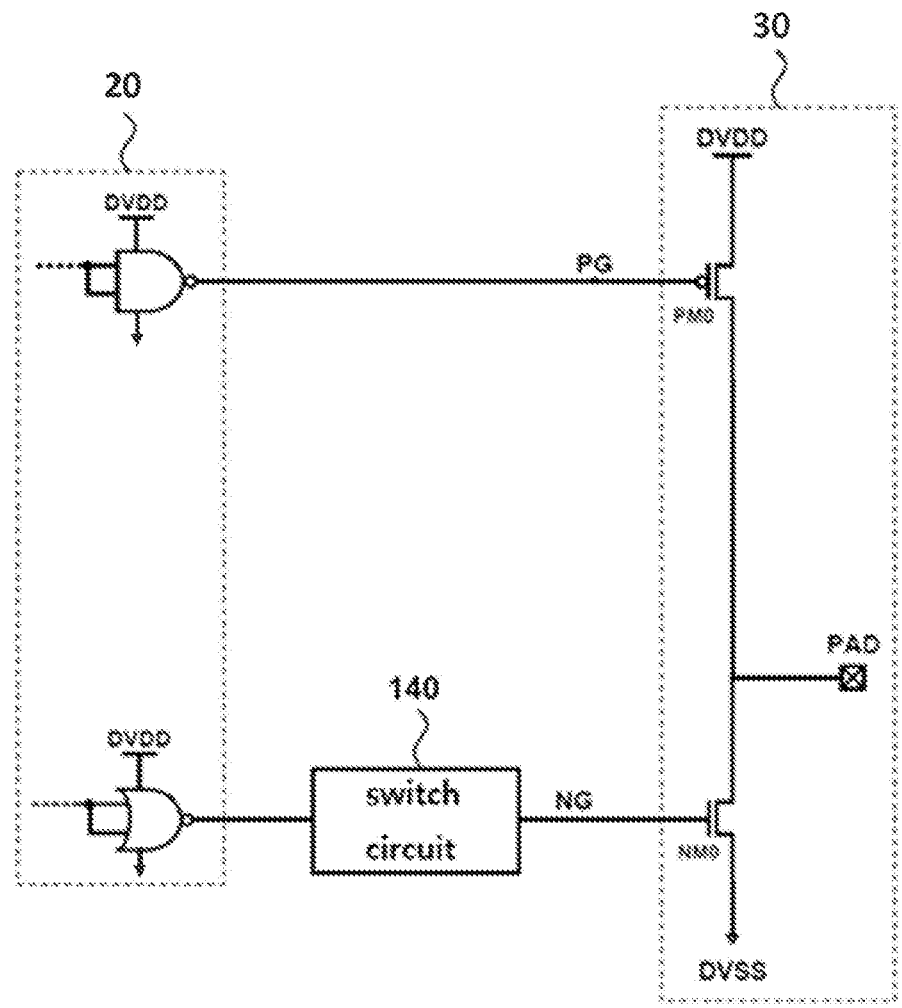
FIGS. 3 and 4 are diagrams illustrating an exemplary switch circuit suitable for the input/output buffer of FIG. 1.

Referring to FIG. 3, the switch circuit 140 is connected between the logic circuit 20 and the driver circuit 30 and/or the pulldown node NG. Herein, the switch circuit 140 is connected to the pulldown node in series (e.g., with the logic circuit 20 and/or the driver circuit 30).

Referring to FIG. 4, the switch circuit 140 includes a PMOS transistor PM1, an NMOS transistor NM1, and a resistor R0.

The gate of the PMOS transistor PM1 connected to the pad at the output of the driver circuit 30 through the resistor R0. The source of the PMOS transistor PM1 is connected to the logic circuit 20. The drain of the PMOS transistor PM1 is connected to the driver circuit 30, and more specifically, to the gate of the NMOS transistor NM0 of the driver circuit 30.

The gate of the NMOS transistor NM1 receives the supply voltage DVDD. The source of the NMOS transistor NM1 is connected to the logic circuit 20. The drain of the NMOS transistor NM1 is connected to the driver circuit 30, and more specifically, to the gate of the NMOS transistor NM0 of the driver circuit 30.

When a "normal" voltage DVDD (e.g., DVDD±10%) is supplied (e.g., to the I/O buffer), the switch circuit 140 operates normally and connects the logic circuit 20 and the pulldown node or NMOS transistor NM1. That is, when the supply voltage DVDD is received at the gate of the NMOS transistor NM1, the NMOS transistor NM1 is on and forms a path between the logic circuit 20 and the pulldown node NG. Accordingly, the supply voltage DVDD or a ground voltage (e.g., 0 V) is applied to the pulldown node NG.

However, when the supply voltage DVDD reaches a ground potential (i.e., the lowest possible supply voltage, due to turning off or disconnecting the power supply to the chip containing the I/O buffer), a positive ESD pulse or event at the pad PAD introduces a current onto the pulldown node NG by an overlap capacitance between the pulldown node at the gate of the NMOS transistor NM0 of the driver circuit 30 and the pad PAD.

Herein, when the ESD event increases the voltage at the pad PAD (and the supply voltage DVDD is at a ground potential), the PMOS transistor PM1 is off, and together the PMOS transistor PM1 and the NMOS transistor NM1 disconnect the logic circuit 20 from the pulldown node and/or the or NMOS transistor NM1. Accordingly, the voltage on the pulldown node NG increases (due to the overlap capacitance with the pad PAD), which turns the NMOS transistor NM0 on, and the current and/or voltage on the pad PAD flows to a ground potential DVSS. Herein, the resistor R0 is an element that protects the gate of the PMOS transistor PM1 from the pad voltage during the positive ESD pulse or event.

When the supply voltage DVDD is supplied (e.g., to the I/O buffer), the switch circuit 140 connects the logic circuit 20 and the pulldown node and/or NMOS transistor NM0. When a positive ESD pulse or event occurs, the switch circuit 140 disconnects the logic circuit 20 and the pulldown node and/or NMOS transistor NM0.

When the supply voltage DVDD is supplied, the pulldown circuit 160 may operate in a sleep mode that does not affect the pullup node PG. When a positive ESD pulse or event occurs (and the supply voltage DVDD is disconnected or at or near a ground potential), the pull-down circuit 160 operates in a pull-down mode, so that the voltage on the pullup node PG approaches or reaches 0 V.

Figure 5:
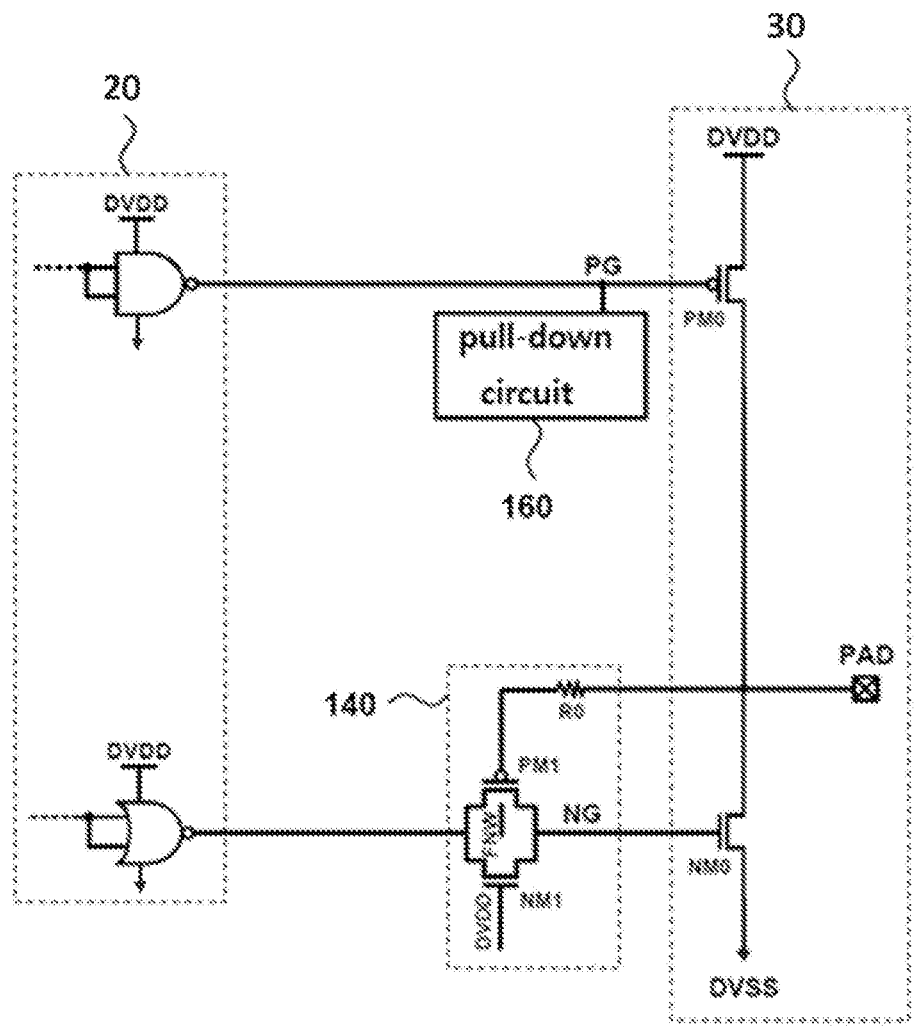
FIGS. 5 and 6 are diagrams illustrating an exemplary pull-down circuit suitable for the input/output buffer of FIG. 1.

Referring to FIG. 5, the pull-down circuit 160 is connected to the pullup node PG among the nodes connecting the logic circuit 20 and the driver circuit 30. Herein, the pull-down circuit 160 may be connected to the pullup node PG in parallel (e.g., with the PMOS driver transistor PM0, relative to the NAND gate in the logic circuit 20).

Figure 6:
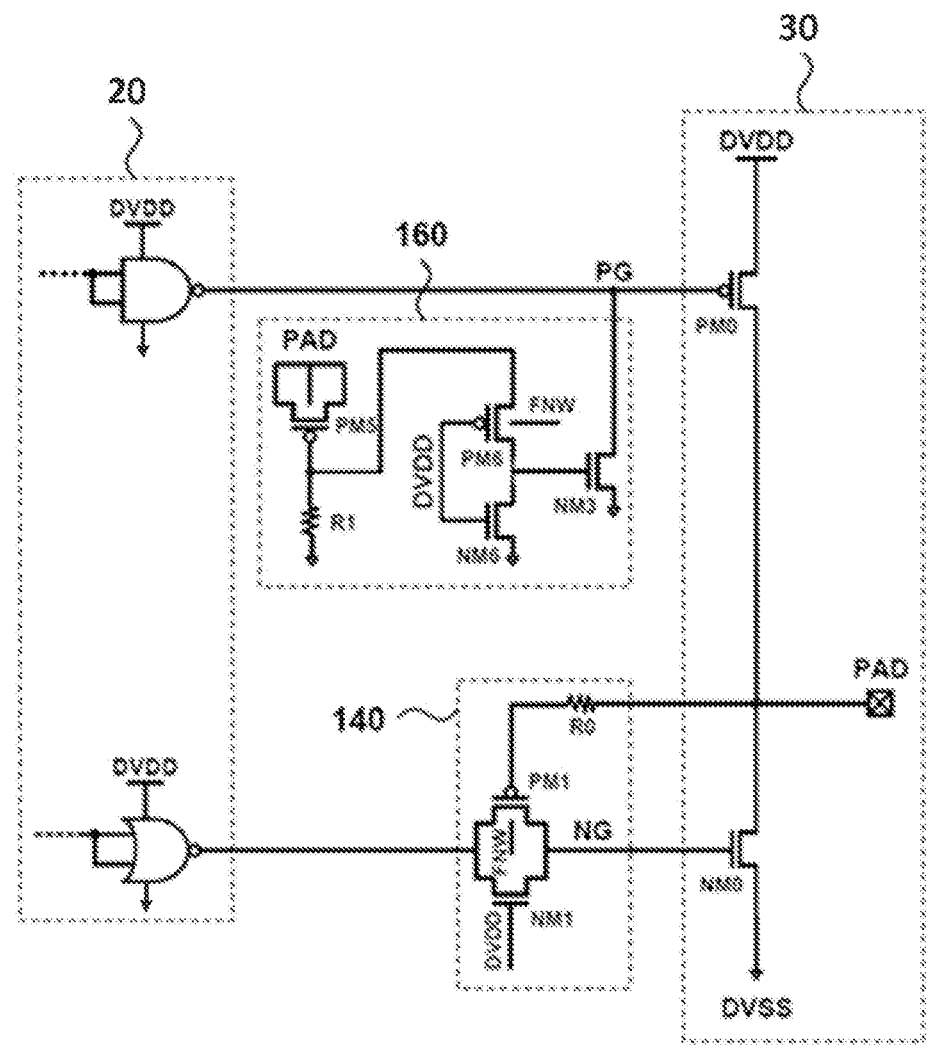

Referring to FIG. 6, the pull-down circuit 160 includes PMOS transistors PM5 and PM6, NMOS transistors NM3 and NM6, and a resistor R1.

The gate of the NMOS transistor NM3 is connected to the drain of the PMOS transistor PM6 and to the source of the NMOS transistor NM6. The source of the NMOS transistor NM1 is connected to the pullup node PG that connects the logic circuit 20 and the driver circuit 30.

The gate of the NMOS transistor NM6 receives supply voltage DVDD. The source of the NMOS transistor NM6 is connected to the drain of the PMOS transistor PM6 and to the gate of the NMOS transistor NM3.

The gate of the PMOS transistor PM5 is connected to the resistor R1 and to the source of the PMOS transistor PM6. The source and the drain of the PMOS transistor PM5 are connected to the pad PAD at the output of the driver circuit 30. Herein, the PMOS transistor PM5 is a MOS capacitor that detects the positive ESD pulse or event, and together the MOS capacitor PM5 and the resistor R1 increase the power to the source of the PMOS transistor PM6 when the positive ESD pulse or event occurs.

The gate of the PMOS transistor PM6 receives the supply voltage DVDD. The source of the PMOS transistor PM6 is connected to the gate of the PMOS transistor PM5. The drain of the PMOS transistor PM6 is connected to the source of the NMOS transistor NM6 and to the gate of the NMOS transistor NM3.

When the supply voltage DVDD is supplied in a "normal" range (e.g., 3.0-3.6 V when DVDD =3.3 V, 4.5-5.5 V when DVDD=5 V, 2.25-2.75 V when DVDD=2.5 V, etc.), the pull-down circuit 160 operates in a sleep mode. That is, when the supply voltage DVDD is in a normal range, the NMOS transistor NM3 is turned off by the NMOS transistor NM6. Accordingly, the ground potential DVSS is disconnected from the pullup node PG. When the pull-down circuit 160 is in sleep mode, it does not affect the pullup node PG.

In contrast, when the supply voltage DVDD approaches or reaches the ground potential (the lowest voltage level, for example as a result of disconnecting power from or not applying power to the chip), the PMOS transistor PM6 is on. increased by the time constant of the During a positive ESD pulse or event, the voltage at the pad PAD is capacitively coupled to the source of the PMOS transistor PM6. Accordingly, the pad voltage is received by the gate of the NMOS transistor NM3, so that the NMOS transistor NM3 turns on. The NMOS transistor NM3 pulls down the voltage on the pullup node PG, and the voltage at the gate of the PMOS transistor PM0 reaches 0 V.

That is, the NMOS transistor NM3 pulls down any increase in the voltage on the pullup node PG caused by an overlap capacitance between the gate and the drain of the PMOS transistor PM0, so as to maintain a voltage of 0 V on the gate of the PMOS transistor PM0. Accordingly, the NMOS transistor NM3 may transfer or shunt at least part of the current on or at the pad PAD to a source of the supply voltage (e.g., the DVDD power lines).

As described above, when the supply voltage DVDD is supplied (e.g., to the I/O buffer), the pull-down circuit 160 operates in sleep mode, which does not affect the pullup node PG. When a positive ESD pulse or event occurs, the pull-down circuit 160 operates in a pull-down mode, so that the voltage on the pullup node PG reaches 0 V or a ground potential.

As described above, the ESD protection circuit for the input/output buffer according to embodiments of the present invention increases the amount of current to be discharged (e.g., from the pad at the output of a driver circuit in the input/output buffer) by detecting an ESD pulse or event and shunting the ESD current through a channel of an ESD device using a control circuit.

In addition, the ESD protection circuit for the input/output buffer according to embodiments of the present invention controls, protects and/or uses both the NMOS transistor and the PMOS transistor (e.g., of a driver circuit in the input/output buffer), thereby enabling discharge of ESD current and/or voltage in two directions (i.e., to the supply voltage DVDD and the ground potential or ground plane DVSS).

In addition, the switch circuit in the ESD protection circuit for the input/output buffer according to embodiments of the present invention solves a problem that occurs when only the NMOS transistor (e.g., in the driver circuit of the input/output buffer) is used (e.g., to shunt ESD current and/or voltage), and the voltage on the pulldown node (e.g., to the driver circuit in the input/output buffer) cannot increase to the supply voltage DVDD during normal operation, and thus, the NMOS transistor in the driver circuit is weakened.

In addition, the pull-down circuit in the ESD protection circuit for the input/output buffer according to various embodiments of the present invention operates only when an ESD pulse or event occurs, to minimize the influence (e.g., of the present ESD protection circuit) on the normal operation (e.g., of the input/output buffer).

In addition, the floating N-well bias circuit in the ESD protection circuit for the input/output buffer according to embodiments of the present invention has a relatively small (e.g., minimum) size, without providing a leakage path during either normal operation or an ESD event (e.g., an ESD current or voltage shunting operation).

The foregoing detailed description illustrates the present invention. In addition, the foregoing illustrates and describes various embodiments of the present invention, which may be utilized in various other combinations, modifications and environments. That is, it is possible to make changes or modifications within the scope of the invention disclosed herein, within the scope of equivalents to the above described disclosure, and/or within the skill and knowledge of the art. The above-described embodiments are intended to describe various modes for carrying out the present invention, and various modifications for specific applications and uses of the present invention are possible. Accordingly, the foregoing detailed description is not intended to limit the present invention to the embodiments disclosed.

What is claimed is:

1. An ESD protection circuit for an input/output buffer including a logic circuit and a driver circuit, the ESD protection circuit comprising:
   a floating N-well bias circuit connected to a pad at an output of the driver circuit, the floating N-well bias circuit having an output voltage based on or in response to a supply voltage;
   a switch circuit connected to a pulldown node that connects the logic circuit and the driver circuit, the switch circuit configured to switch a connection between the logic circuit and the driver circuit based on or in response to the supply voltage; and a pull-down circuit connected to a pullup node that connects the logic circuit and the driver circuit, the pull-down circuit outputting a voltage to the driver circuit based on or in response to the supply voltage, wherein the floating N-well bias circuit comprises one or more PMOS transistors and an NMOS transistor, the switch circuit is connected to the pulldown node in series, and comprises a PMOS transistor and an NMOS transistor, and the pull-down circuit is connected to the pullup node in parallel.

2. The ESD protection circuit of claim 1, wherein the output voltage of the floating N-well bias circuit is a floating N-well bias voltage, and the floating N-well bias circuit is configured to output the supply voltage as the floating N-well bias voltage during normal operation.

3. The ESD protection circuit of claim 1, wherein the output voltage of the floating N-well bias circuit is a floating N-well bias voltage, and the floating N-well bias circuit is configured to output a voltage on the pad as the floating N-well bias voltage when the supply voltage is at or near a ground potential.

4. The ESD protection circuit of claim 1, wherein the switch circuit connects the logic circuit and the pulldown node to the driver circuit when the supply voltage is in a normal range.

5. The ESD protection circuit of claim 1, wherein the switch circuit disconnects the logic circuit and the pulldown node when an ESD pulse or event occurs.

6. The ESD protection circuit of claim 1, wherein the pull-down circuit operates in a sleep mode when the supply voltage is in a normal range.

7. The ESD protection circuit of claim 1, wherein the pull-down circuit outputs a ground potential or a voltage of 0 V to the pullup node when an ESD pulse or event occurs.

* * * * *